United States Patent
Kim (10) Patent No.: US 8,559,256 B2
(45) Date of Patent: Oct. 15, 2013

(54) NON-VOLATILE MEMORY DEVICE AND SENSING METHOD THEREOF

(75) Inventor: Dong Keun Kim, Icheon (KR)

(73) Assignee: Hynix Semiconductor Inc., Icheon (KR)

( * ) Notice: Subject to any disclaimer, the term of this patent is extended or adjusted under 35 U.S.C. 154(b) by 239 days.

(21) Appl. No.: 13/212,369

(22) Filed: Aug. 18, 2011

(65) Prior Publication Data

US 2012/0287730 A1    Nov. 15, 2012

(30) Foreign Application Priority Data

May 11, 2011 (KR) .................. 10-2011-0044206

(51) Int. Cl.
*G11C 7/00* (2006.01)
(52) U.S. Cl.
USPC .......................................... 365/204; 365/203
(58) Field of Classification Search
USPC ................. 365/204, 203, 207, 210.1
See application file for complete search history.

(56) References Cited

U.S. PATENT DOCUMENTS

| | | | |
|---|---|---|---|
| 7,539,059 B2 * | 5/2009 | Lee et al. ................. | 365/185.21 |
| 2004/0213031 A1 | 10/2004 | Hosono et al. | |
| 2006/0227591 A1 * | 10/2006 | Lowrey et al. ................ | 365/148 |

FOREIGN PATENT DOCUMENTS

KR    10-2004-0091583 A    10/2004

* cited by examiner

*Primary Examiner* — Vu Le (57) ABSTRACT

A non-volatile memory device and a sensing method thereof are disclosed, which can sense multi-level data using resistance variation. The non-volatile memory device includes a cell array and a sensing unit. The cell array includes a plurality of unit cells where data is read out or written. The sensing unit compares a sensing voltage corresponding to data stored in the unit cell with a reference voltage, amplifies/outputs the compared result, measures a difference in discharge time where the sensing voltage is discharged in response to a resistance value of the unit cell during an activation period of a sensing enable signal after a bit line is precharged, and senses the data in response to the measured result.

21 Claims, 11 Drawing Sheets

NON-VOLATILE MEMORY DEVICE AND SENSING METHOD THEREOF

CROSS-REFERENCE TO RELATED APPLICATION

The priority of Korean patent application No. 10-2011-0044206 filed on May 11, 2011, the disclosure of which is hereby incorporated in its entirety by reference, is claimed.

BACKGROUND OF THE INVENTION

Embodiments of the present invention relate to a non-volatile memory device and a sensing method thereof, and more specifically, to a non-volatile memory device configured to sense multi-level data using resistance variation.

Memory devices may be classified into volatile memory devices and non-volatile memory devices. Non-volatile memory devices include a non-volatile memory cell capable of preserving stored data even when not powered. For example, a non-volatile memory device may be implemented as a flash random access memory (flash RAM), a phase change random access memory (PCRAM), or the like.

A PCRAM includes a memory cell that is implemented using a phase change material such as germanium antimony tellurium (GST), wherein the GST changes to a crystalline phase or an amorphous phase if heat is applied to the GST, thereby storing data in the memory cell.

A non-volatile memory device (e.g., a magnetic memory, a phase change memory (PCM), or the like) has a data processing speed similar to that of a volatile RAM device. The non-volatile memory device also preserves data even when power is turned off.

Figure 1A:
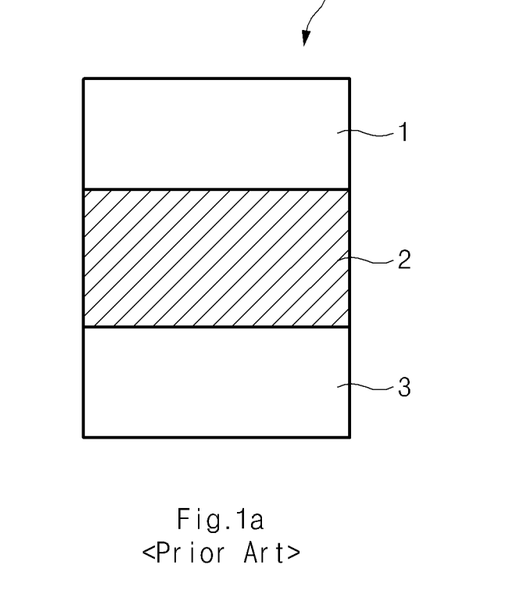
FIGS. 1A and 1B illustrate a conventional phase change resistor (PCR) element.
Figure 1B:
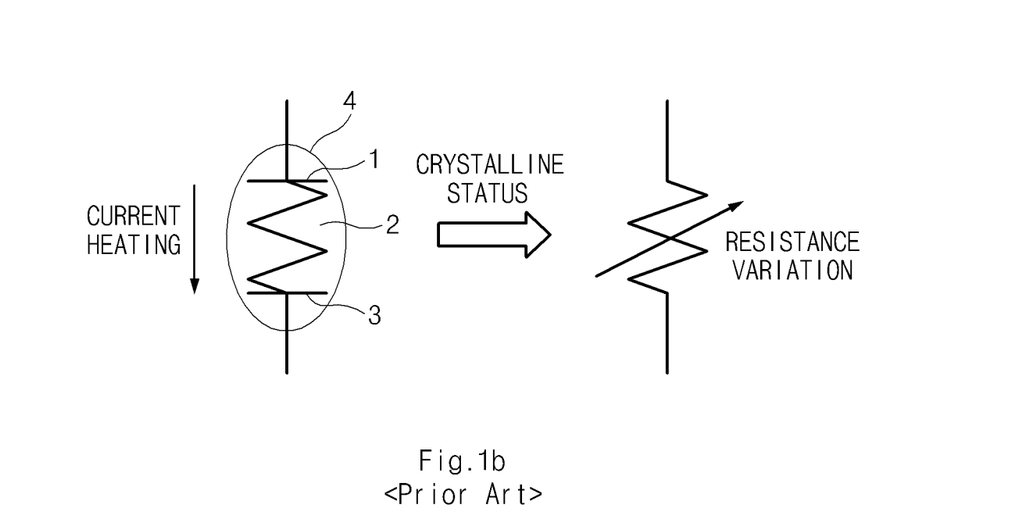

FIGS. 1A and 1B illustrate a conventional phase change resistor (PCR) element 4.

Referring to FIGS. 1A and 1B, the PCR element 4 includes a top electrode 1, a bottom electrode 3, and a phase change material (PCM) layer 2 located between the top electrode 1 and the bottom electrode 3. If a voltage and a current are applied to the top electrode 1 and the bottom electrode 3, a current signal is provided to the PCM layer 2, and a high temperature is induced in the PCM layer 2, such that the electrical conductive state of the PCM layer 2 changes depending on resistance variation.

Figure 2A:
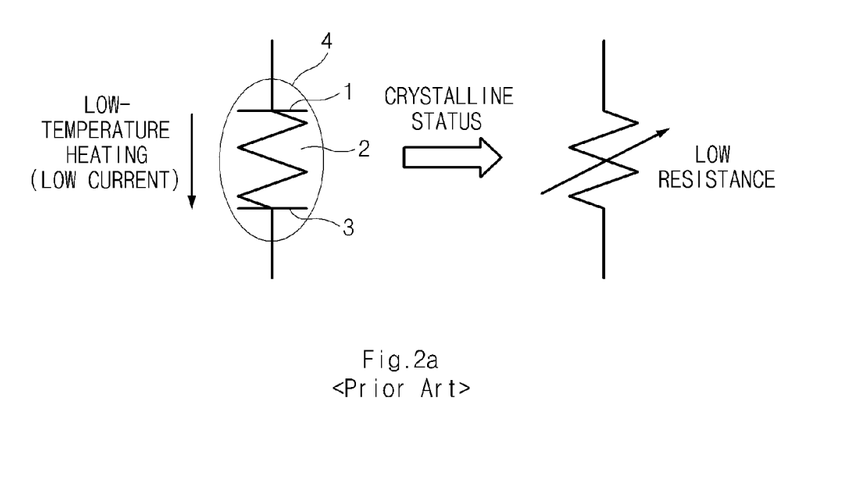
FIGS. 2A and 2B illustrate principles of data storage in the conventional PCR element.
Figure 2B:
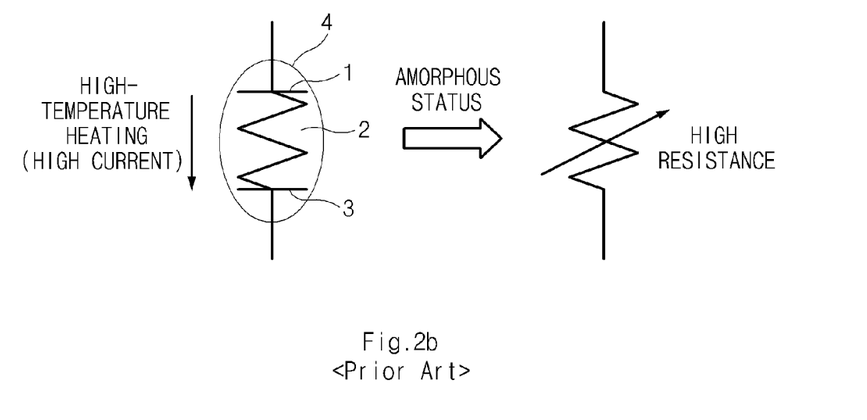

FIGS. 2A and 2B illustrate a phase change principle of the conventional PCR element 4.

Referring to FIG. 2A, if a low current, smaller than a threshold value, flows in the PCR element 4, the PCM layer 2 has a temperature suitable for a crystalline phase. Therefore, the PCM layer 2 changes to the crystalline phase, such that it becomes a low-resistance phase material. As a result, a current may flow between the top electrode 1 and the bottom electrode 3.

On the other hand, as shown in FIG. 2B, if a high current, greater than the threshold value, flows in the PCR element 4, the PCM layer 2 has a higher temperature than a melting point. Therefore, the PCM layer 2 changes to an amorphous phase, such that it becomes a high-resistance phase material. As a result, it is difficult for the current to flow between the top electrode 1 and the bottom electrode 3.

As described above, the PCR element 4 can store data corresponding to two resistance phases as non-volatile data. For example, assuming that in one case the PCR element 4 has a low-resistance phase that corresponds to data '1' and in the other case the PCR element 4 has a high-resistance phase that corresponds to data '0', the PCR element 4 may store two logic states of data.

In addition, a phase of the PCM layer (i.e., a phase change resistive material) 2 is not changed although the phase change memory device is powered off, such that the aforementioned data can be stored as non-volatile data.

Figure 3:
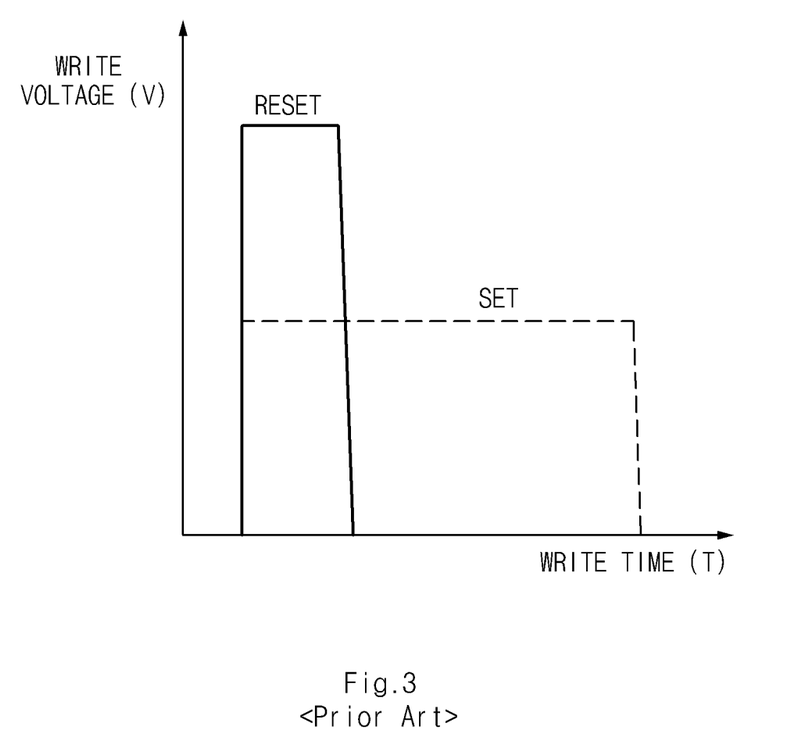
FIG. 3 illustrates a write operation of a conventional PCR cell.

FIG. 3 illustrates a write operation of a conventional PCR cell.

Referring to FIG. 3, when a current flows between the top electrode 1 and the bottom electrode 3 of the PCR element 4 for a predetermined time, heat is generated.

When a low current, smaller than a threshold value, flows in the PCR element 4 during the predetermined time, the PCM layer 2 has a crystalline phase formed by a low-temperature heating state, such that the PCR element 4 becomes a low-resistance element having a set state.

On the other hand, when a high current, greater than the threshold value, flows in the PCR element 4 during the predetermined time, the PCM layer 2 has the amorphous phase formed by a high-temperature heating state, such that the PCR element 4 becomes a high-resistance element having a reset state.

Accordingly, in order to write data of the set state during the write operation, a low voltage is applied to the PCR element 4 for a long period of time. On the other hand, in order to write data of the reset state during the write operation, a high voltage is applied to the PCR element 4 for a short period of time.

The PCR memory device applies a sensing current to the PCR element 4 during a sensing operation, such that it can sense data stored in the PCR element 4.

Figure 4:
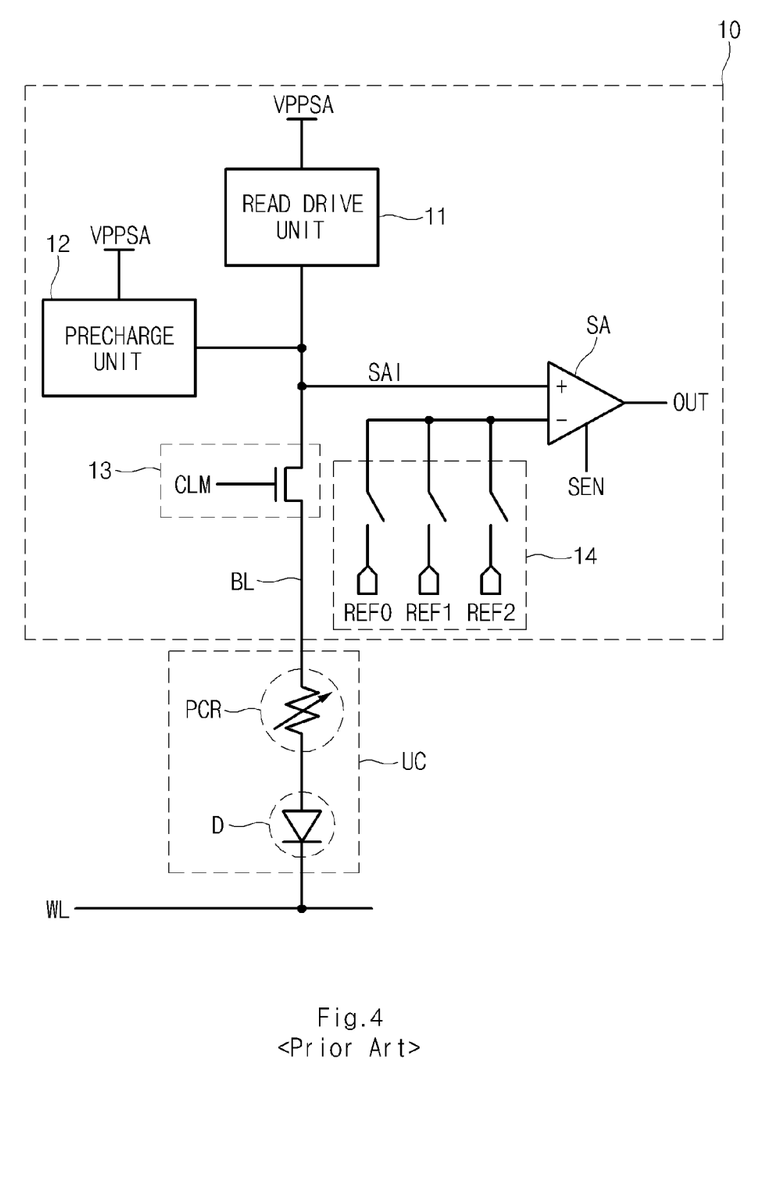
FIG. 4 is a circuit diagram illustrating a conventional phase change memory device.

FIG. 4 is a circuit diagram illustrating a sensing unit 10 of a conventional phase change memory device.

Referring to FIG. 4, the sensing unit 10 includes a read drive unit 11, a precharge unit 12, a clamping unit 13, a reference voltage selection unit 14, and a sense amplifier (sense-amp) (SA).

A unit cell UC includes a phase change resistor (PCR) element and a diode D.

The read drive unit 11 drives a high voltage VPPSA in response to a current driving signal so that it outputs a sensing voltage SAI.

The precharge unit 12 precharges the sensing voltage SAI with a high voltage VPPSA level in response to a precharge signal.

The clamping unit 13 clamps a voltage level of the sensing voltage SAI in response to a clamping control signal CLM during a sensing operation.

The reference voltage selection unit 14 selects one of a plurality of reference voltages REF0 to REF2 and outputs the selected reference voltage REF to the sense amplifier SA.

The sense amplifier SA compares the selected reference voltage REF with the sensing voltage SAI in response to a sense-amp enable signal SEN, and amplifies the compared result to output an amplified signal. The sense amplifier SA receives the sensing voltage SAI through a positive (+) input terminal, and receives one of the reference voltages REF0 to REF2 through a negative (−) input terminal.

If a resistance state of a cell is determined by a write operation, the precharge unit 12 precharges a read path with the high voltage (VPPSA) level, and is then deactivated. In addition, the read drive unit 11 provides the read path with a current to be used for the sensing operation.

Figure 5:
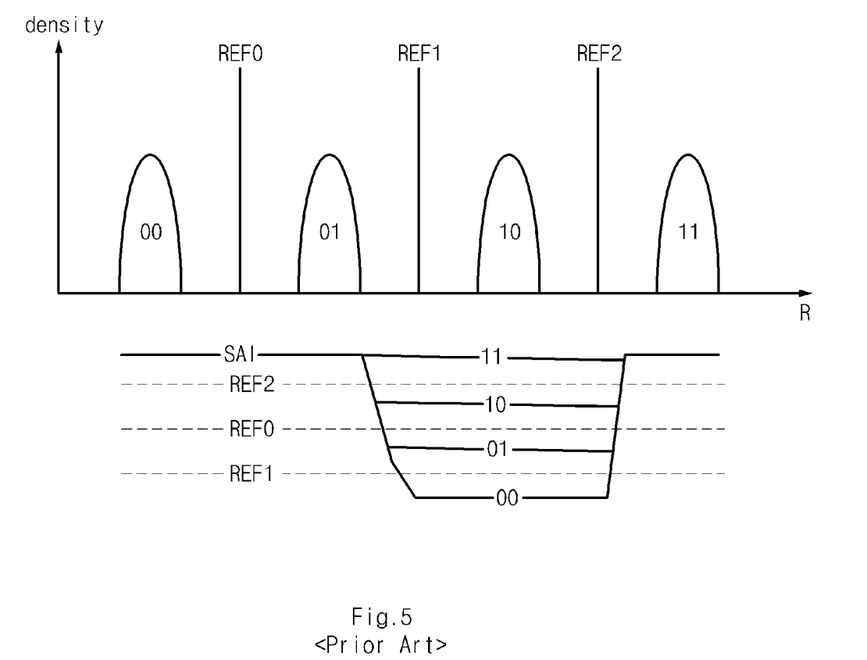
FIG. 5 shows the distribution of cell resistance and a sensing output level in the phase change memory device shown in FIG. 4.

A level of the sensing voltage SAI may be determined, as shown in FIG. 5, according to the relationship between a threshold voltage Vt of an NMOS transistor contained in the clamping unit 13 and a gate source voltage Vgs formed in a bit line BL in response to cell resistance.

FIG. 5 shows the distribution of cell resistance and a sensing output level in the phase change memory device shown in FIG. 4.

At least two read operations are required to sense data having 2 bits from one cell. Specifically, when sensing the 2-bit data in one cell, the read operation is performed by distinguishing four states from one another.

That is, when sensing the 2-bit data in one cell, one of four states "00", "01", "10" and "11" is identified according to a resistance value of data stored in the cell. In order to identify such four-state data, three reference voltages REF0 to REF2 are required.

If a value of the cell data is less than the reference voltage REF0, data "00" is identified. If the cell data value is higher than the reference voltage REF0, data "01" is identified. If the cell data value is higher than the reference voltage REF1, data "10" is identified. If the cell data value is less than the reference voltage REF2, data "10" is identified. If the cell data value is higher than the reference voltage REF2, data "11" is identified.

In this way, if four resistance states are distinguished from one another, the read operation needs to be performed three times. In order to perform the read operation three times, the reference voltage selection unit 14 selects one of the reference voltages REF0 to REF2, and outputs the selected voltage to the sense amplifier SA. Then the sense amplifier SA senses the voltage level of the sensing voltage SAI, which is determined by a resistance value of data stored in the cell.

However, if the number of bits of read data increases, the number of times the read operation is performed for one cell should be increased, or several reference voltage levels should be applied according to a sensing scheme, resulting in difficulty in application or implementation.

That is, when using several reference voltage levels, the reference voltage selection unit 14 take longer to change a reference voltage. Furthermore, when changing the reference voltage, the occurrence of noise may increase. In addition, if the number of reference voltage levels increases, an area for setting reference lines increases.

Figure 6:
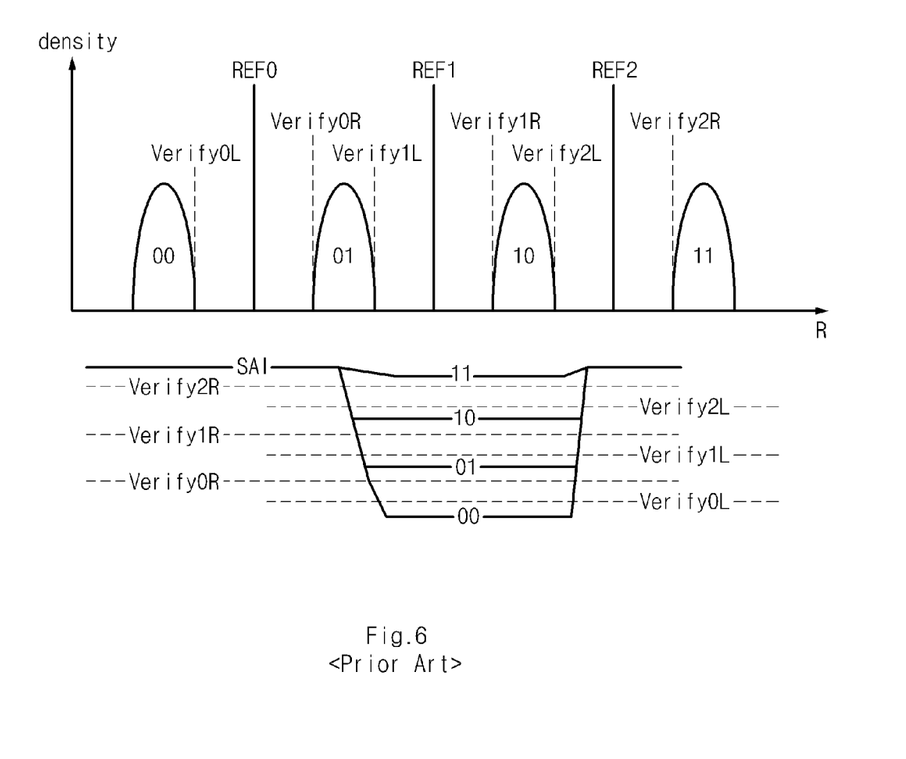
FIG. 6 is a conceptual diagram illustrating a conventional verification operation performed to improve the distribution of cell resistance in the phase change memory device shown in FIG. 4.

FIG. 6 is a conceptual diagram illustrating a verification operation performed to improve the distribution of cell resistance in the phase change memory device shown in FIG. 4.

When sensing multi-level data, the verification operation is performed by reading the position of a cell where a write operation is completed, thereby determining whether to perform an additional write operation.

In order to improve the distribution of cell resistance, it is necessary to perform a read operation after changing the reference levels REF0 to REF2 to verification levels, as shown in FIG. 6.

In this case, the reference voltage REF0 is changed to verification levels Verify01 and Verify0R, the reference voltage REF1 is changed to verification levels Verify1L and Verify1R, and the reference voltage REF2 is changed to verification levels Verify2L and Verify2R.

However, in order to perform the verification operation, the read operation must be performed at least six times. In addition, in order to change three reference voltage levels REF0 to REF2 to the verification levels, additional control is required.

Therefore, in order to perform such a verification operation, the number of read operations increases. If the reference voltage level is changed, an increase in noise occurs. In addition, it takes a long time to change the reference voltage level, and an area of a driver for controlling verification levels increases.

BRIEF SUMMARY OF THE INVENTION

Various embodiments of the present invention are directed to providing a non-volatile memory device and a sensing method thereof that substantially obviate one or more problems due to limitations and disadvantages of the related art.

First, since an embodiment of the present invention detects a difference in time at which a precharged bit line is discharged in response to a cell resistance value to sense multi-level data, it is possible to reduce the number of times that a read operation is performed and to implement a simple control mechanism for a verification operation, thereby reducing a circuit area related to the control of the read operation.

Second, since an embodiment of the present invention detects a specific point in time at which a precharged bit line is discharged according to a cell resistance value by using a clock-pulse-shaped sensing enable signal to sense data, it is possible to reduce the number of times that a read operation is performed and to implement a simple verification control mechanism, thereby reducing a circuit area related to the control of the read operation.

In accordance with one embodiment of the present invention, a non-volatile memory device includes a cell array including a plurality of unit cells; and a sensing unit configured to compare a sensing voltage corresponding to data stored in the unit cell with a reference voltage, in response to a sensing enable signal and amplify a comparison result to produce and output signal, wherein the sensing unit measures a difference in time when the sensing voltage is discharged in response to a voltage level of a bit line corresponding to a resistance value of the unit cell during an activation period of the sensing enable signal after the bit line is precharged, and senses the data in response to the measured result.

In accordance with another embodiment of the present invention, a sensing method of a non-volatile memory device includes precharging a bit line, clamping a voltage level of the bit line corresponding to a resistance value of a unit cell; discharging a sensing voltage in response to the voltage level of the bit line corresponding to data stored in a unit cell; detecting a level of the sensing voltage at intervals of a predetermined time during an activation period of a sensing enable signal to measure a difference in time where the sensing voltage is discharged in response to the voltage level of the bit line; and sensing the data stored in the unit cell based on the measured result.

It is to be understood that both the foregoing general description and the following detailed description of the present invention are exemplary and explanatory and are intended to provide further explanation of the invention as claimed.

DESCRIPTION OF EMBODIMENTS

Reference will now be made in detail to the embodiments of the present invention, examples of which are illustrated in the accompanying drawings. Wherever possible, the same reference numbers will be used throughout the drawings to refer to the same or like parts.

Figure 7:
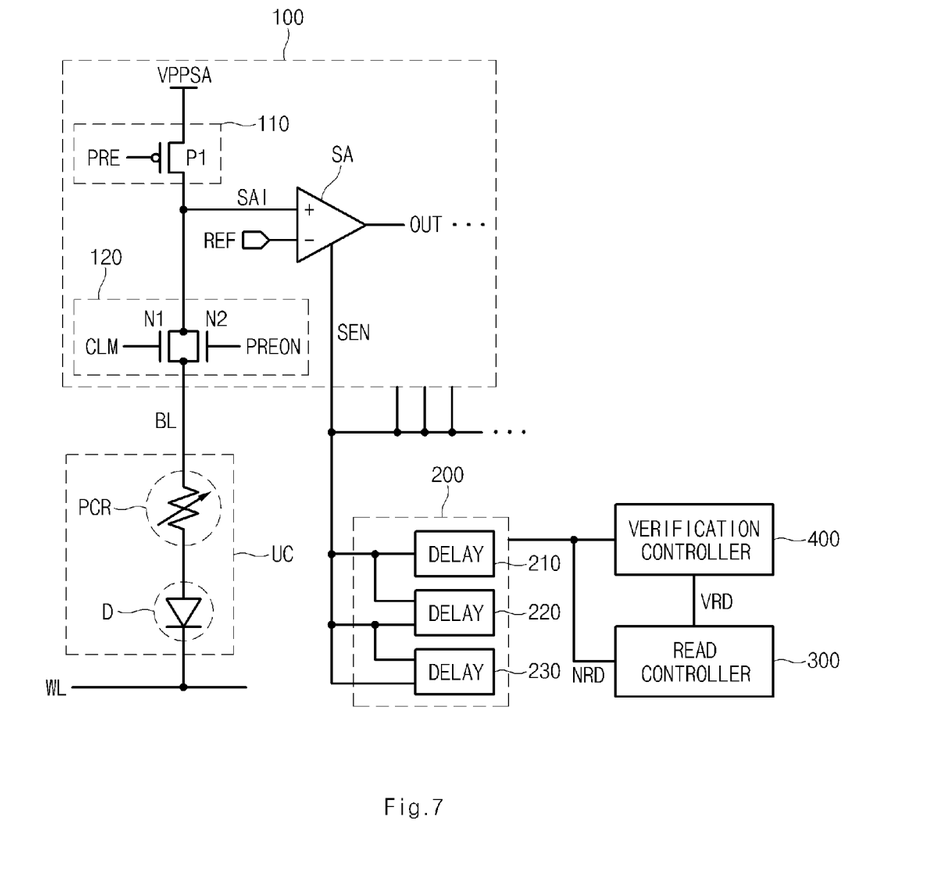
FIG. 7 is a circuit diagram illustrating a non-volatile memory device according to an embodiment of the present invention.

FIG. 7 is a circuit diagram illustrating a non-volatile memory device according to an embodiment of the present invention.

Referring to FIG. 7, the non-volatile memory device includes a sensing unit 100, a unit cell UC, a sensing controller 200, a read controller 300, and a verification controller 400.

In this embodiment, the sensing unit 100 includes a precharge unit 110, a clamping unit 120, and a sense amplifier SA. The sensing controller 200 includes a plurality of delay units 210 to 230. The non-volatile memory device includes a plurality of unit cells UCs to make a cell array. Each unit cell UC may include a phase change resistor (PCR) element and a diode D. The PCR element is coupled to and disposed between a bit line BL and the diode D. The PCR element may have a different resistance value according to data stored therein.

The diode D is coupled to and disposed between the PCR element and a word line WL. The diode D, which is capable of reducing a cell area, is used as a switching device. The diode D enables a current to flow only in a forward direction, and prevents a current from flowing in a reverse direction. In the phase change memory device according to one embodiment of the present invention, a direction from the bit line BL to the word line WL may be the forward direction.

When a forward current flows in the PCR element, a value of a current passing through the PCR element is inversely proportional to the resistance of the PCR element.

The precharge unit 110 precharges a sensing voltage SAI with a high voltage VPPSA level in response to a precharge signal PRE. The precharge unit 110 includes a PMOS transistor P1 that is coupled to and disposed between a high voltage VPPSA input terminal and the clamping unit 120 so as to receive the precharge signal PRE through a gate terminal.

If a diode-type switching device is used in the unit cell UC, a read operation requires a high voltage because of a high threshold voltage of the diode.

For this operation, the precharge unit 110 uses a high voltage VPPSA that is greater than a peri-voltage VPERI used for the read operation. The peri-voltage VPERI is used to drive peripheral circuits and thus usually uses an external input voltage. Therefore, the sensing voltage SAI is driven with the VPPSA level, which is greater than the peri-voltage VPERI level.

The clamping unit 120 clamps a voltage level of the sensing voltage SAI in response to a clamping control signal CLM during a sensing operation. In this embodiment, a precharge control signal PREON of the clamping unit 120 is enabled in a complementary manner with the precharge signal PRE. If the precharge signal PRE goes to a low level, the precharge control signal PREON goes to a high level.

The clamping unit 120 includes a first NMOS transistor N1 and a second NMOS transistor N2 coupled to and parallel to the NMOS transistor N1. The NMOS transistor N1, acting as a clamping element, is coupled to and disposed between the precharge unit 110 and the bit line BL so that it receives the clamping control signal CLM through a gate terminal. The NMOS transistor N2, acting as a precharge element, is coupled to and disposed between the precharge unit 110 and the bit line BL so that it receives the precharge control signal PREON through a gate terminal.

For example, during the sensing operation, if the clamping control signal CLM having a high level is input to the clamping unit 120, the NMOS transistor N1 is turned on so that the clamping unit 120 clamps a level of the sensing voltage SAI received from the bit line BL. On the other hand, when the sensing operation is not performed, if the clamping control signal CLM having a low level is input to the clamping unit 120, the NMOS transistor N1 is turned off so that a voltage level of the bit line BL is not transferred to the sensing voltage SAI through the clamping unit 120.

The sense amplifier SA compares a reference voltage REF with the sensing voltage SAI in response to a sense-amp enable signal SEN, and amplifies the compared result, thereby outputting an amplified signal. The sense amplifier SA receives the sensing voltage SAI through a positive (+) input terminal, and receives the reference voltage REF through a negative (−) input terminal.

During a normal read operation, the read controller 300 activates a normal read signal NRD, and outputs the activated normal read signal NRD to the sensing controller 200. During a verification read operation, the read controller 300 activates a verification read signal VRD, and outputs the activated verification read signal VRD to the verification controller 400.

The delay units 210 to 230 contained in the sensing controller 200 sequentially delay the normal read signal NRD during the normal read operation, so that the sensing enable signal SEN can be activated at different points of time.

The verification controller 400 includes a plurality of delay units 210 to 230 that sequentially delay the verification read signal VRD, and outputs the delayed verification read signal VRD to the sensing controller 200 during the verification read operation. Then, the delay units 210 to 230 of the sensing controller 200 sequentially delay the output signal of the verification controller 400 and output the sense-amp enable signal SEN during the verification read operation.

Figure 8:
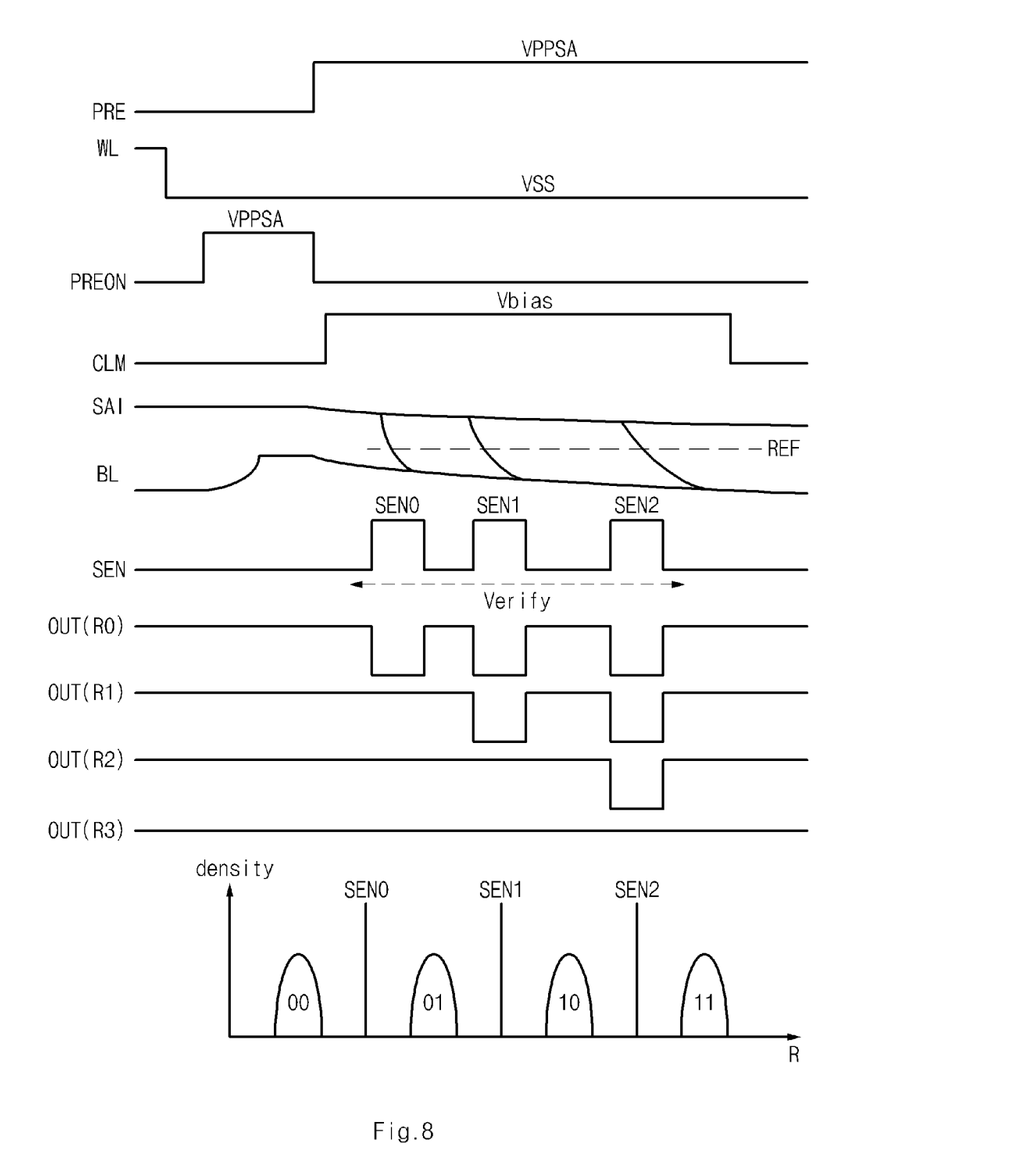
FIG. 8 is a timing diagram illustrating operations of the non-volatile memory device shown in FIG. 7.

FIG. 8 is a timing diagram illustrating operations of the non-volatile memory device shown in FIG. 7.

First, when a resistance state of the unit cell UC is determined by a write operation, the precharge signal PRE is activated to a low level during a precharge period. At this time, the word line WL is activated to a low level, so that a resistance value of the unit cell UC is output to the bit line BL.

As a result, the PMOS transistor P1 of the precharge unit 110 is turned on, so that the sensing voltage SAI is precharged with the VPPSA level.

Thereafter, if the precharge signal PRE is deactivated to a high level when entering a read operation period, the PMOS transistor P1 of the precharge unit 110 is turned off.

If the precharge signal PRE is deactivated to the high level, a data developing operation is executed. If the precharge signal PRE is deactivated to the high level, a precharge operation is ended and a sensing operation starts.

During the precharge period, the precharge control signal PREON is activated to a high level, and thus the NMOS transistor N2 is turned on. Therefore, the bit line BL goes to a high level and is precharged with the VPPSA level.

When entering the read operation period, the clamping control signal CLM is activated to a bias voltage Vbias level suitable for a read path and cell resistance distribution. In this case, the precharge control signal PREON goes to a low level, so that the NMOS transistor N2 is turned off.

As the NMOS transistor N1 is turned on, the level of the sensing voltage SAI gradually lowers in response to a resistance value of cell data.

In this embodiment, depending on the relationship between a threshold voltage Vt of the transistor N1 contained in the clamping unit 120 and a gate source voltage Vgs formed in the bit line BL in response to the cell resistance, the NMOS transistor N1 is turned on at different points in time, so that the sensing voltage SAI goes to a low level.

That is, the voltage level of the bit line BL is discharged with a slope that varies in response to the cell resistance.

At this time, under the condition the sensing enable signal SEN is activated, the sense amplifier SA compares the reference voltage REF with the sensing voltage SAI, and amplifies the compared result, so that it outputs an output signal OUT. That is, the sensing enable signal SEN is activated in response to a delay time decided by the delay units 210-230, so that it is possible to discriminate a resistance state of the unit cell UC within a predetermined period.

For example, if the sensing enable signal SEN is activated three times by the delay units 210 to 230, the sense amplifier SA outputs different output signals OUT in response to the resistance value of cell data.

If the resistance value is detected during the activation time of each of the sensing enable signals SEN0 to SEN2, the resistance R0 is sensed. If a resistance value is detected during the activation time of each of the sensing enable signals SEN1 and SEN2, the resistance R1 is sensed. If the resistance value is detected only once during the activation time of the sensing enable signal SEN2, the resistance R2 is sensed. If no resistance value is detected, the resistance R3 is sensed.

In this embodiment, the resistance R0 is identified by data "00", the resistance R1 is identified by data "01", the resistance R2 is identified by data "10", and the resistance R2 is identified by data "11".

Therefore, when sensing 2-bit data (i.e., four numbers of data) from one unit cell UC, one read operation is required, and the sensing enable signal SEN is activated three times. As the unit cell UC has a lower resistance value, the NMOS transistor N1 of the clamping unit 120 is turned on more quickly, so that the output signals OUT of the sense amplifier SA can be sequentially represented.

That is, when sensing N numbers of multi-data, the sensing controller 200 controls the sensing enable signal SEN to be sequentially activated during (N−1) number of periods, wherein N is a natural number.

Subsequently, if the clamping control signal CLM goes to a low level, the sensing operation is completed.

As described above, the embodiment of the present invention detects a time difference at which a voltage level of the precharged bit line BL is discharged in response to the resistance value of the unit cell UC, so that it can sense multi-level data.

The embodiment of the present invention, as described above, is designed to adjust a delay time of the sense-amp enable signal SEN to change a verification level, whereas the related art has changed the level of the reference voltage REF to perform the verification read operation.

In more detail, in this embodiment of the present invention, during the normal read operation, the read controller 300 activates the normal read signal NRD and outputs it to the sensing controller 200. During the verification read operation, the read controller 300 activates the verification read signal VRD, and outputs it to the verification controller 400.

The verification controller 400 generates a delay pulse, required for the verification read operation, to the sensing controller 200 when the verification read signal VRD is activated.

The sensing controller 200 adjusts an activation timing point of the sensing enable signal SEN in response to a delay time of the verification controller 400 and a delay time of the delay units 210 to 230, so that a current verification level can be changed to another verification level.

When performing the verification operation to improve the cell resistance distribution during a write operation of a multi-level cell, the relationship between a first cell resistance value obtained before the write operation is performed and a second cell resistance value obtained after the write operation is performed may affect the number of times the verification operation must be performed. Therefore, if a resistance value obtained before the write operation is accurately recognized, the number of times the write operation must be performed can be reduced.

Figure 9:
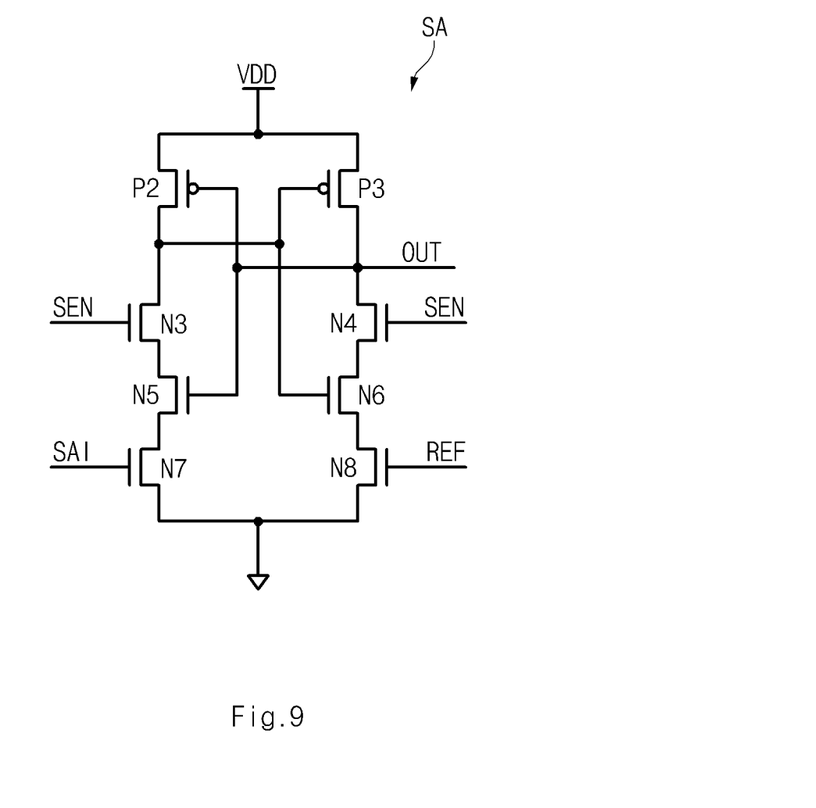
FIG. 9 is a detailed circuit diagram illustrating a sense amplifier shown in FIG. 7.

FIG. 9 is a detailed circuit diagram illustrating the sense amplifier SA shown in FIG. 7.

Referring to FIG. 9, the sense amplifier SA includes PMOS transistors P2 and P3 and a plurality of NMOS transistors N3 to N8. The PMOS transistors P2 and P3 and the NMOS transistors N5 and N6 are cross-coupled to one another, and are driven to a power-supply voltage VDD level. The PMOS transistors P2 and P3 correspond to a pull-up driver, and the NMOS transistors N5 and N6 correspond to a pull-down driver.

The NMOS transistors N7 and N8, serving as driving transistors, are coupled between a ground voltage terminal and the NMOS transistors N5 and N6, respectively. The NMOS transistor N7 receives the sensing voltage SAI through a gate terminal, and the NMOS transistor N8 receives the reference voltage REF through a gate terminal.

The NMOS transistors N7 and N8 compare the sensing voltage SAI with the reference voltage REF, and amplify the compared result.

The NMOS transistors N3 and N4 are coupled between drain terminals of the PMOS transistors P2 and P3, respectively, and drain terminals of the NMOS transistors N5 and N6, respectively, and they receive the sense-amp enable signal SEN through their gate terminals. The NMOS transistors N3 and N4 correspond to an activation unit for controlling the activation or deactivation of the sense amplifier SA.

The above-mentioned sense amplifier SA is activated when the sense-amp enable signal SEN goes to a high level, so that it compares the sensing voltage SAI with the reference voltage VREF and amplifies the compared result.

Figure 10:
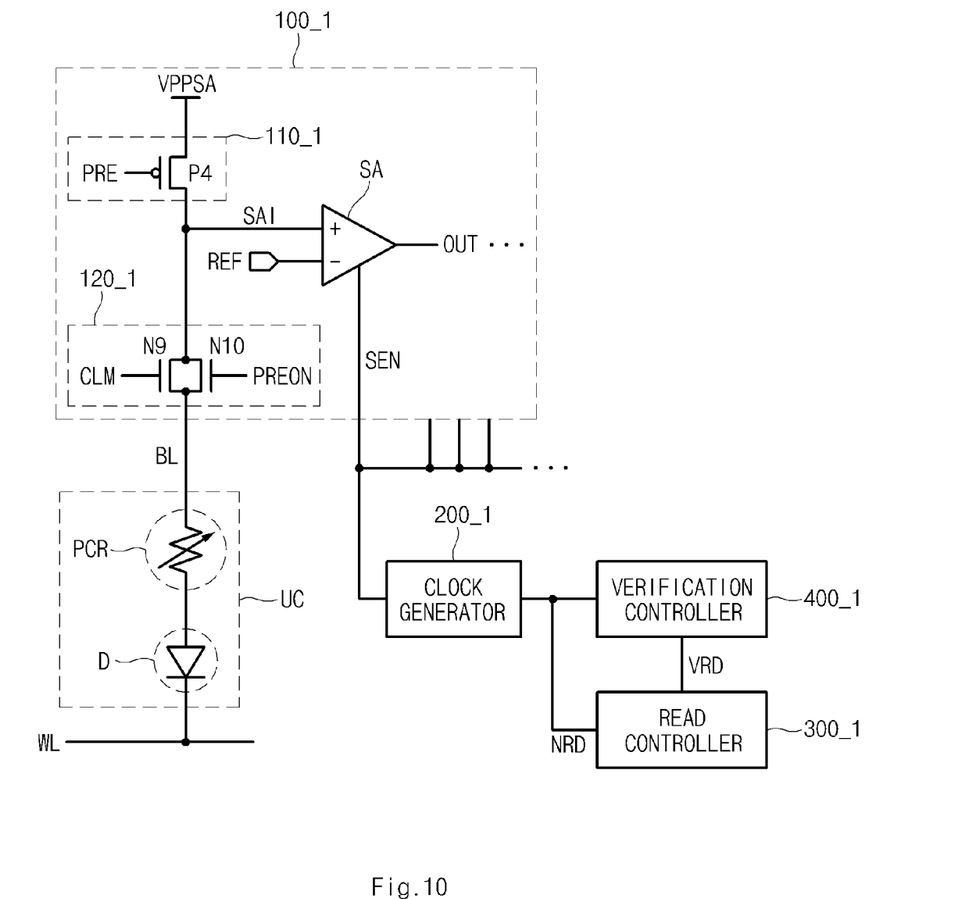
FIG. 10 is a circuit diagram illustrating a non-volatile memory device according to another embodiment of the present invention.

In accordance with another embodiment of the present invention, a clock control scheme shown in FIG. 10 may be used instead of the delay scheme shown in FIG. 7 to sense a resistance level of the unit cell.

FIG. 10 is a circuit diagram illustrating a non-volatile memory device according to another embodiment of the present invention.

Referring to FIG. 10, the non-volatile memory device includes a sensing unit 100_1, a unit cell UC, a clock generator 200_1, a read controller 300_1, and a verification controller 400_1.

The sensing unit 100_1 includes a precharge unit 110_1, a clamping unit 120_1, and a sense amplifier SA.

The non-volatile memory device shown in FIG. 10 includes a plurality of unit cells UCs to make a cell array. Each unit cell UC may include a phase change resistor (PCR) element and a diode D. The PCR element is coupled to and disposed between a bit line BL and the diode D. The PCR element may have a different resistance value according to stored data.

The diode D is forward coupled to and disposed between the PCR element and a word line WL. Herein, the diode D, which is capable of reducing a cell area is used as a switching device. The diode D enables a current to flow only in a forward direction, and prevents a current from flowing in a reverse direction. In the phase change memory device according to one embodiment of the present invention, a direction from the bit line BL to the word line WL may be the forward direction.

When a forward current flows in the PCR element, a value of a current passing through the PCR element is inversely proportional to the resistance of the PCR element.

The precharge unit 110_1 precharges a sensing voltage SAI with a high voltage VPPSA level in response to a precharge signal PRE. The precharge unit 110_1 includes a PMOS transistor P4 that is coupled to and disposed between a high voltage VPPSA input terminal and the clamping unit 120_1 so as to receive the precharge signal PRE through a gate terminal.

The clamping unit 120_1 clamps a voltage level of the sensing voltage SAI in response to a clamping control signal CLM during a sensing operation. In this case, a precharge control signal PREON of the clamping unit 120_1 is enabled in a complementary manner with the precharge signal PRE. If the precharge signal PRE goes to a low level, the control signal PREON goes to a high level so that the clamping unit 120_1 is activated.

The clamping unit 120_1 includes a first NMOS transistor N9 and a second NMOS transistor N10, which are coupled and parallel to each other. In this case, the NMOS transistor N9 is coupled to and disposed between the precharge unit 110_1 and the bit line BL so that it receives the clamping control signal CLM through a gate terminal. The NMOS transistor N10 is coupled to and disposed between the precharge unit 100_1 and the bit line BL so that it receives the precharge control signal PREON through a gate terminal.

For example, if the sensing operation is performed, and a clamping control signal CLM having a high level is input to the clamping unit 120_1, the NMOS transistor N9 is turned on so that the clamping unit 120_1 clamps the level of the sensing voltage SAI received from the bit line BL. On the other hand, if the sensing operation is not performed, and a clamping control signal CLM having a low level is input to the clamping unit 120_1, the NMOS transistor N9 is turned off so that the clamping unit 120_1 does not clamp the level of the sensing voltage SAI.

The sense amplifier SA compares a reference voltage REF with the sensing voltage SAI in response to a sense-amp enable signal SEN and amplifies the compared result and outputs an amplified signal. The sense amplifier SA receives the sensing voltage SAI through a positive (+) input terminal and the reference voltage REF through a negative (−) input terminal.

During a normal read operation, the read controller 300_1 activates a normal read signal NRD and outputs the activated normal read signal NRD to the clock generator 200_1. During a verification read operation, the read controller 300_1 activates a verification read signal VRD and outputs the activated verification read signal VRD to the verification controller 400_1.

During the normal read operation, the clock generator 200_1 generates a clock pulse in response to the normal read signal NRD and outputs the sensing enable signal SEN in the form of a clock signal to the sense amplifier SA. In accordance with this embodiment, a sensing controller is implemented as the clock generator 200_1 and generates the clock pulse differently from the embodiment shown in FIG. 7.

The verification controller 400_1 includes a plurality of delay units (not shown). The delay units sequentially delay the verification read signal VRD during the verification read operation, and output the delayed verification read signal VRD to the clock generator 200_1. As a result, during the verification read operation, the sense-amp enable signal SEN, which is selectively delayed in response to the delayed verification read signal VRD, is output.

Figure 11:
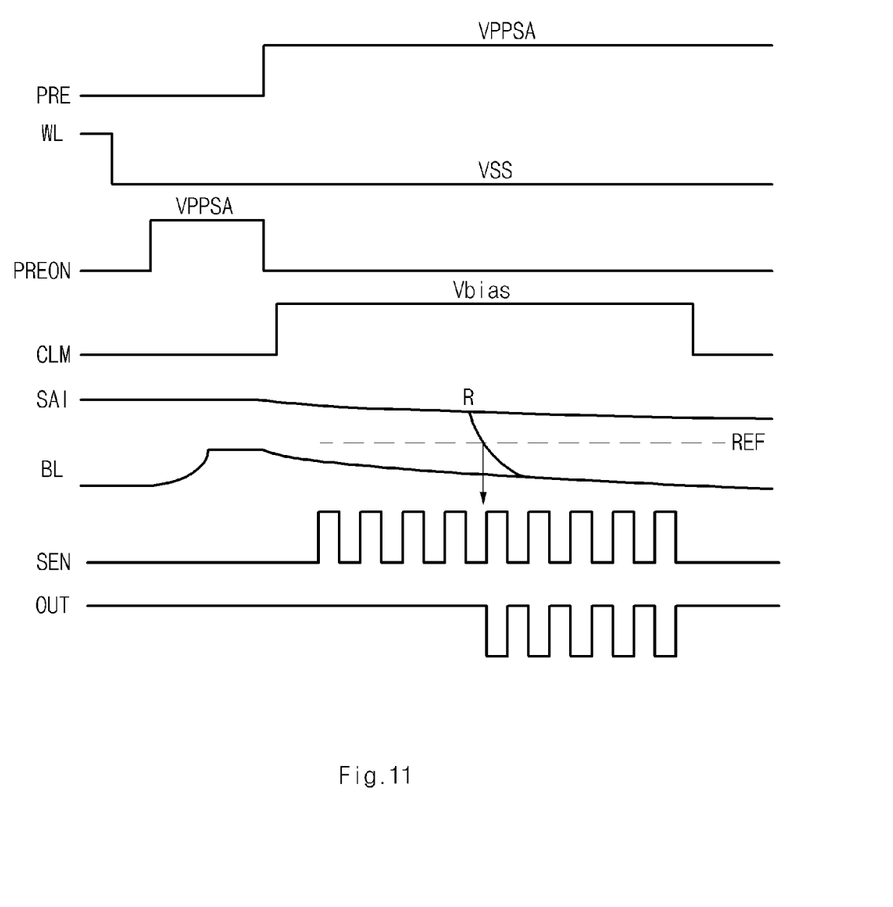
FIG. 11 is a timing diagram illustrating operations of the non-volatile memory device shown in FIG. 10.

FIG. 11 is a timing diagram illustrating operations of the non-volatile memory device shown in FIG. 10.

Referring to FIG. 11, when a resistance state of the unit cell UC is determined by a write operation, the precharge signal PRE is activated to a low level during a precharge period. At this time, the word line WL is activated to a low level, so that a resistance value of the unit cell UC is output to the bit line BL.

As the precharge signal PRE is activated, the PMOS transistor P4 of the precharge unit 110_1 is turned on, so that the sensing voltage SAI is precharged with the VPPSA level.

Thereafter, if the precharge signal PRE is deactivated to a high level when entering a read operation period, the PMOS transistor P4 of the precharge unit 110_1 is turned off.

If the precharge signal PRE is deactivated to the high level, the data developing operation is executed. If the precharge signal PRE is deactivated to the high level, a precharge operation is ended and a sensing operation starts.

During the precharge period, the precharge control signal PREON is activated to a high level, and thus the NMOS transistor N10 is turned on. Therefore, the bit line BL level increases and is precharged with the VPPSA level.

When entering the read operation period, the clamping control signal CLM is activated to a bias voltage Vbias level suitable for a read path and cell resistance distribution. In this case, the precharge control signal PREON goes to a low level, so that the NMOS transistor N10 is turned off.

As the NMOS transistor N9 is turned on, the sensing voltage SAI gradually lowers in response to a resistance value of cell data.

Depending on the relationship between a threshold voltage Vt of the transistor N9 in the clamping unit 120_1 and a gate source voltage Vgs formed in the bit line BL in response to the cell resistance, the NMOS transistor N9 is turned on at a different point in time, so that the sensing voltage SAI goes to a low level.

That is, the voltage level of the bit line BL is discharged with a slope that varies in response to the cell resistance.

At this time, under the condition the sensing enable signal SEN is activated in the form of a clock pulse, the sense amplifier SA compares the reference voltage REF with the sensing voltage SAI, and amplifies the compared result to output an output signal OUT.

In other words, if a resistance value R is detected at a point in when the sensing voltage SAI is less than the reference voltage REF, the sense amplifier SA outputs the output signal OUT. A resistance value of the output signal OUT is identified so that the cell data is sensed. In this case, the output signal OUT is output as a clock signal, and the number of clocks included in the clock signal changes according to a resistance value of the sensed data. Therefore, the cell data is sensed by detecting the number of clocks from the output signal OUT.

The NMOS transistor N9 of the clamping unit 120_1 is turned on depending on the resistance value R. Therefore, a specific point in time at which the output signal OUT starts to transition to a low level is indicative of a position of the resistance value R. As a result, a resistance value obtained before the write operation can be more accurately recognized.

In accordance with this embodiment of the present invention, the number of enable times of the sensing enable signal SEN is determined in response to a period of the clock generator 200_1, and the output signal OUT is output at a position determined by the resistance value of the unit cell UC.

Subsequently, if the clamping control signal CLM transitions to a low level, the sensing operation is completed.

In this way, this embodiment of the present invention detects a specific time when the precharged bit line BL is discharged in response to the resistance value of the unit cell UC, and as a result, sensing data is stored in the unit cell UC.

This embodiment of the present invention adjusts a delay time of the sense-amp enable signal SEN to change a current verification level to another verification level, whereas in the related art, the level of the reference voltage REF is changed to perform the verification read operation.

In more detail, according to an embodiment of the present invention, during the normal read operation, the read controller 300_1 activates the normal read signal NRD, and outputs the activated normal read signal NRD to the clock generator 200_1. During the verification read operation, the read controller 300_1 activates the verification read signal VRD, and outputs the activated verification read signal VRD to the verification controller 400_1.

When the verification read signal VRD is activated, the verification controller 400_1 generates a delay pulse required for the verification read operation to the clock generator 200_1.

The clock generator 200_1 adjusts an activation time of the sensing enable signal SEN in response to a delay time of the verification controller 400_1 and a clock delay time of the clock generator 200_1, thereby changing a current verification level to another verification level.

For convenience of description and better understanding of the present invention, although the aforementioned embodiments of the present invention have disclosed a non-volatile memory device including a phase change memory device as an example, the scope and spirit of the present invention is not limited thereto and can also be applicable to a variety of resistive memory devices based on resistance variation. For example, the present invention may also be applicable to a ferroelectric capacitor, a spin torque transfer (SU) device, a magneto-resistive device, a resistive random access memory (ReRAM) device, and the like.

In addition, the aforementioned embodiments of the present invention have exemplarily disclosed that a non-volatile memory element of the unit cell UC is a PCR element and that the switching unit is a diode D. However, although a diode-type element, generally beneficial to the cell area, has been used to describe an embodiment of the non-volatile memory device according to the present invention, the scope and spirit of the present invention is not limited thereto. The present invention may also be applied to other non-volatile memory devices, and any other switching unit may be used.

As is apparent from the above description, embodiments of the present invention have the following characteristics.

First, since embodiments of the present invention detect a difference in time at which a precharged bit line is discharged in response to a cell resistance value to sense multi-level data, it is possible to reduce the number of times that a read operation is performed and to simply implement a mechanism for controlling a verification operation, thereby reducing a circuit area related to the control of the read operation.

Second, since embodiments of the present invention detect a specific point in time at which a precharged bit line is discharged according to a cell resistance value by using a clock-pulse-shaped sensing enable signal to sense data, it is possible to reduce the number of times that a read operation is performed and to simply implement a verification control mechanism, thereby reducing a circuit area related to the control of the read operation.

Those skilled in the art will appreciate that the present invention may be carried out in other specific ways than those set forth herein without departing from the spirit and essential characteristics of the present invention. The above exemplary embodiments are therefore to be construed in all aspects as illustrative and not restrictive. The scope of the invention should be determined by the appended claims and their legal equivalents, not by the above description, and all changes coming within the meaning and equivalency range of the appended claims are intended to be embraced therein. Also, it is obvious to those skilled in the art that claims that are not explicitly cited in each other in the appended claims may be presented in combination as an exemplary embodiment of the present invention or included as a new claim by a subsequent amendment after the application is filed.

Although a number of illustrative embodiments consistent with the invention have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A non-volatile memory device comprising:
   a cell array including a plurality of unit cells; and
   a sensing unit configured to compare a sensing voltage corresponding to data stored in the unit cell with a reference voltage in response to a sensing enable signal and amplify a comparison result to produce an output signal, wherein the sensing unit measures a difference in time when the sensing voltage is discharged in response to a voltage level of a bit line corresponding to a resistance value of the unit cell during an activation period of the sensing enable signal after the bit line is precharged, and senses the data in response to the measured result.

2. The non-volatile memory device according to claim 1, further comprising:
   a sensing controller configured to control the sensing enable signal to be activated at least one time at different points in time.

3. The non-volatile memory device according to claim 2, wherein the sensing controller includes:
   a plurality of delay units configured to control an activation time of the sensing enable signal.

4. The non-volatile memory device according to claim 2, wherein the sensing controller controls the sensing enable signal to be sequentially activated during (N−1) numbers of periods when sensing one of N numbers of multiple data, N being a natural number.

5. The non-volatile memory device according to claim 2, wherein the sensing controller includes a clock generator that is configured to generate the sensing enable signal having a clock pulse.

6. The non-volatile memory device according to claim 5, wherein the sensing unit generates a clock-shaped output signal from a specific time when the resistance value of the unit cell is detected during the activation period of the sensing enable signal.

7. The non-volatile memory device according to claim 5, wherein the sensing unit determines the number of enable times of the sensing enable signal in response to a clock period of the clock generator.

8. The non-volatile memory device according to claim 2, further comprising:
a read controller configured to output a normal read signal for controlling an operation of the sensing controller and a verification read signal for controlling a verification operation; and
a verification controller configured to change a delay time of the sensing controller in response to the verification read signal.

9. The non-volatile memory device according to claim 1, wherein the sensing unit includes:
a precharge unit configured to precharge the bit line with a high voltage level in response to a precharge signal during a precharge operation;
a clamping unit configured to clamp the sensing voltage in response to a bias voltage level during a read operation; and
a sense amplifier configured to compare the sensing voltage with the reference voltage when the sensing enable signal is activated, and amplify a comparison result.

10. The non-volatile memory device according to claim 9, wherein the clamping unit includes:
a clamping element configured to clamp a voltage level of the sensing voltage in response to a clamping control signal; and
a precharge element coupled to and parallel to the clamping element and configured to precharge the bit line in response to a precharge control signal.

11. The non-volatile memory device according to claim 10, wherein the clamping element and the precharge element operate in a complementary manner.

12. The non-volatile memory device according to claim 9, wherein the sense amplifier includes:
a pull-up driver configured to drive the output signal with a power-supply voltage;
a pull-down driver cross-coupled to the pull-up driver;
a driving unit configured to operate in response to the sensing voltage and the reference voltage; and
an activation unit coupled to the pull-up driver and the pull-down driver and configured to be driven in response to the sensing enable signal.

13. The non-volatile memory device according to claim 1, wherein if a slope of a voltage level of the bit line changes in response to the resistance value of the unit cell after a precharge operation is completed, the sensing unit measures the voltage level of the bit line during the activation period of the sensing enable signal to sense the data stored in the unit cell.

14. A sensing method of a non-volatile memory device, the method comprising:
precharging a bit line;
clamping a voltage level of the bit line corresponding to a resistance value of a unit cell;
discharging a sensing voltage in response to the voltage level of the bit line corresponding to data stored in a unit cell;
detecting a level of the sensing voltage at intervals of a predetermined time during an activation period of a sensing enable signal to measure a difference in time where the sensing voltage is discharged in response to the voltage level of the bit line; and
sensing the data stored in the unit cell based on the measured result.

15. The sensing method according to claim 14, wherein the sensing of the sensing voltage includes:
comparing the sensing voltage with a reference voltage.

16. The sensing method according to claim 14, wherein the sensing of the sensing voltage includes:
sensing one of N numbers of multiple data in association with the unit cell, N being a natural number.

17. The sensing method according to claim 16, wherein the sensing enable signal is sequentially activated during (N-1) numbers of periods when sensing the multiple data stored in the unit cell.

18. The sensing method according to claim 14, further comprising:
sequentially sensing N numbers of multiple data during the activation period of the sensing enable signal, and verifying the sensed data, N being a natural number.

19. The sensing method according to claim 14, further comprising:
generating the sensing enable signal in the form of a clock pulse during the activation period of the sensing enable signal.

20. The sensing method according to claim 19, wherein the sensing of the data comprises:
sensing the data stored in the unit cell at a specific time when a resistance value of the unit cell is detected during the activation period of the sensing enable signal.

21. The sensing method according to claim 19, further comprising:
generating a clock-shaped output signal of a sense amplifier during the activation period of the sensing enable signal,
wherein the data stored in the unit cell is sensed by recognizing the number of clocks included in the clock-shaped output signal.

* * * * *